United States Patent
Han

(10) Patent No.: US 10,045,454 B2
(45) Date of Patent: Aug. 7, 2018

(54) CASING OF ELECTRONIC DEVICE

(71) Applicant: MITSUBISHI ELECTRIC CORPORATION, Tokyo (JP)

(72) Inventor: Fuqiang Han, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/572,928

(22) PCT Filed: Aug. 4, 2015

(86) PCT No.: PCT/JP2015/072036
§ 371 (c)(1),
(2) Date: Nov. 9, 2017

(87) PCT Pub. No.: WO2017/022066
PCT Pub. Date: Feb. 9, 2017

(65) Prior Publication Data
US 2018/0160558 A1 Jun. 7, 2018

(51) Int. Cl.
*H05K 7/04* (2006.01)
*H05K 5/00* (2006.01)
*H05K 7/14* (2006.01)

(52) U.S. Cl.
CPC .............. *H05K 7/04* (2013.01); *H05K 5/0013* (2013.01); *H05K 7/14* (2013.01)

(58) Field of Classification Search
CPC ........... H05K 7/04; H05K 7/14; H05K 5/0013
See application file for complete search history.

(56) References Cited

U.S. PATENT DOCUMENTS

| | | | | |
|---|---|---|---|---|
| 6,876,543 B2* | 4/2005 | Mockridge | ......... | H04M 1/0249 361/752 |
| 7,209,195 B2* | 4/2007 | Lin | .................. | G02F 1/133308 349/58 |
| 7,940,287 B2* | 5/2011 | Kim, II | ............. | G02F 1/133308 345/102 |
| 8,480,186 B2* | 7/2013 | Wang | ................... | H05K 5/0013 312/223.1 |
| 2009/0175020 A1* | 7/2009 | Zadesky | ............... | G06F 1/1626 361/818 |
| 2010/0270305 A1* | 10/2010 | Yamamoto | ......... | B65D 43/0204 220/315 |

FOREIGN PATENT DOCUMENTS

| | | |
|---|---|---|
| JP | 01-133782 U1 | 9/1989 |
| JP | 03-037251 Y2 | 8/1991 |
| JP | 2553883 Y2 | 11/1997 |
| JP | 2006-196773 A | 7/2006 |
| JP | 2012-52571 A | 3/2012 |

OTHER PUBLICATIONS

International Search Report for PCT/JP2015/072036 (PCT/ISA/210) dated Nov. 10, 2015.

* cited by examiner

*Primary Examiner* — Adrian S Wilson
(74) *Attorney, Agent, or Firm* — Birch, Stewart, Kolasch & Birch, LLP

(57) ABSTRACT

A circuit board (7) is fixed with a screw (8), using a component attachment part (21) cut and raised from a bottom plate part (20) of a bottom chassis (2) toward the inner side of a casing (1). An opening part (22) formed by cutting and raising of the component attachment part (21) is closed by attachment of a rear chassis (5), and the bottom chassis (2) and the rear chassis (5) come into contact with each other via an elastic piece (52).

2 Claims, 3 Drawing Sheets

CASING OF ELECTRONIC DEVICE

TECHNICAL FIELD

The present invention relates to a casing of an electronic device holding components.

BACKGROUND ART

Conventionally, in assembly of an electronic device, components such as a circuit board is fixed to a casing, using a cylindrical post attached to an inner bottom surface of the casing, for example, by crimping. A female screw is formed on an inner circumferential surface of the cylindrical post. A component having a screw hole formed therein is placed on the cylindrical post and they are screwed together so that the component is fixed to the casing via the post. However, since the post which is a part different to the casing is used, there is a possibility that the number of components and the cost are increased disadvantageously.

In contrast, for example, Patent Literature 1 discloses a configuration in which a circuit board is fixed without a post. Specifically, in Patent Literature 1, it is described that an attachment portion of a printed circuit board is formed by cutting and raising a part of a sheet metal frame and bending it. By attaching the circuit board directly to the sheet metal frame, it is possible to establish the grounding of the circuit board. Although a hole in the sheet metal frame formed by the cutting and raising can be an inlet through which foreign substances intrude from the outside, the hole is configured to be closed by a cover member.

CITATION LIST

PATENT LITERATURE

Patent Literature 1

Japanese Patent Application Publication No. 2006-196773

SUMMARY OF INVENTION

Technical Problem

In the configuration described in Patent Literature 1, a post is not required, but it is required to provide a dedicated cover member to close the hole of the sheet metal frame. Further, in this configuration, there is a possibility to enhance the Electro Magnetic Compatibility (EMC) by securing electric conductivity between sheet metal frames in addition to the electric conductivity between a sheet metal frame and a circuit board, which generally requires a configuration in which a conductive gasket or the like is provided and is pinched between sheet metal frames.

As described above, in order to enhance the EMC and deal with foreign substances, it is required to provide a dedicated separate member, and as a result, there is a problem that the number of components and the cost are increased.

Furthermore, in the configuration described in Patent Literature 1, the cover member is fit into the sheet metal frame, and then the printed circuit board is screwed to the printed circuit board attachment portion. Although the cover member can effectively prevents foreign substances from intruding, it disadvantageously keeps metal chips, which are foreign substances produced during screwing, within the internal space, without discharging them to the outside.

The present invention has been made to solve the above problems, and an object of the present invention is to provide a casing of an electronic device in which components can be fixed without providing a post, and the EMC can be enhanced and a countermeasure for foreign substances can be provided by assembling of members forming a casing.

Solution to Problem

A casing of an electronic device according to the present invention includes: a base face formed by a first sheet metal member including a component attachment part formed by cutting and raising from the first sheet metal member toward an inner side of the casing so as to form an opening part, the component attachment part having a screw hole for fixing a component, the screw hole being provided at a position opposite the opening part; and a side face formed by a side plate part included in a second sheet metal member, the second sheet metal member including: a plate part which has an elastic piece having a free end and formed by cutting and raising from the second sheet metal member toward the inner side of the casing; and the side plate part bent from the plate part. The plate part of the second sheet metal member overlaps with the first sheet metal member at an outer side of the casing and closes the opening part. The free end of the elastic piece passes through the opening part from the outer side to the inner side of the casing and comes into contact with an edge part of the opening part.

Advantageous Effects of Invention

According to the present invention, a component can be fixed without providing a post, and it is possible to enhance the EMC and provide a countermeasure for foreign substances by assembling of members forming a casing.

DESCRIPTION OF EMBODIMENTS

Some embodiments of the present invention will now be described in more detail with reference to the accompanying drawings.

Embodiment 1

Figure 1:
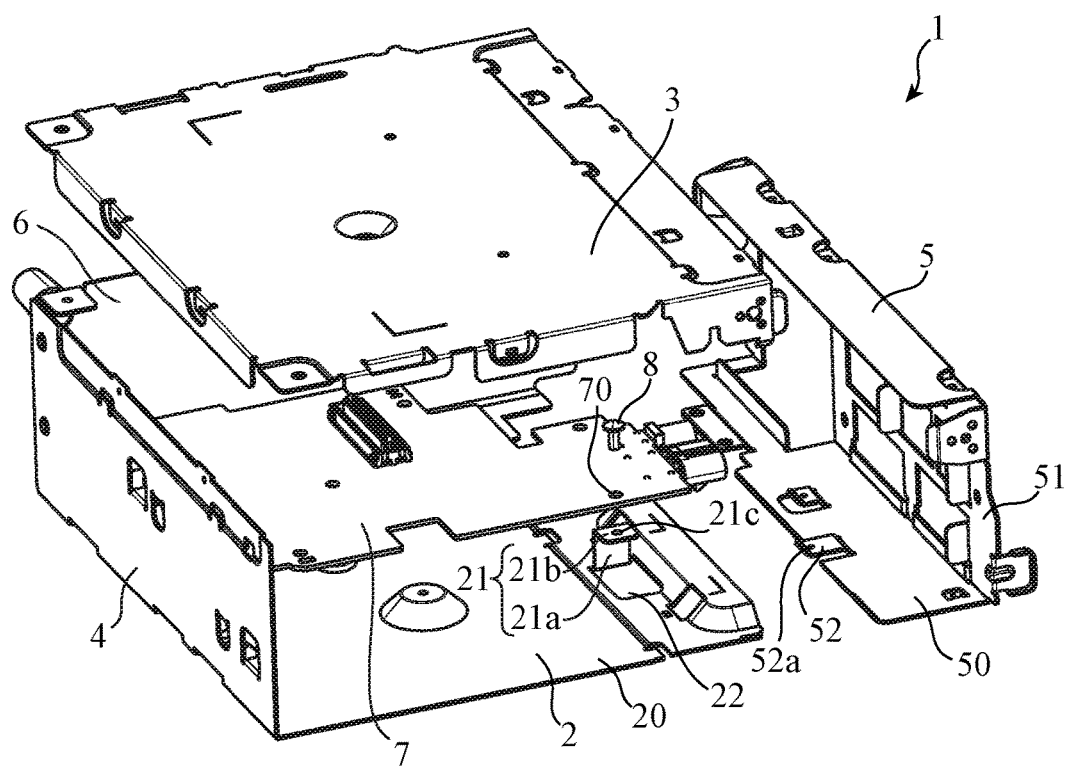
FIG. 1 is an exploded perspective view of a casing of an electronic device according to an embodiment 1 of the present invention.

FIG. 1 illustrates an exploded perspective view of a casing 1 of an electronic device according to an embodiment 1 of the present invention. The casing 1 is used, for example, as a casing of a car navigation device. The casing 1 includes a bottom chassis 2, a top chassis 3, a front chassis 4, a rear chassis 5, and side chassis 6, and holds components such as a circuit board 7 in its interior. Each of the chassis in the casing 1 is made, for example, by processing a sheet metal appropriately.

The bottom chassis 2 has a component attachment part 21 cut and raised from a bottom plate part 20 toward the inner side of the casing 1 by so-called Z bending. The component attachment part 21 has a wall 21a substantially vertically raised to seamlessly extend from an edge part of an opening part 22 continuously toward the inner side of the casing 1 and being integrated with the bottom plate part 20 of the bottom chassis 2, and a stand part 21b extending substantially in parallel with the bottom plate part 20 from the tip end of the wall 21a seamlessly and formed to be integrated with the wall 21a continuously. A screw hole 21c for fixing a component such as the circuit board 7 is formed in the stand part 21b by burring and tapping processing.

The opening part 22 is formed in the bottom chassis 2 by cutting and raising of the component attachment part 21. The screw hole 21c is opposite the opening part 22.

The bottom chassis 2 is a first sheet metal member of the casing 1.

The top chassis 3 is provided opposite the bottom chassis 2.

The front chassis 4 and the side chassis 6 are provided substantially orthogonally to the bottom chassis 2 and the top chassis 3. Note that, the side chassis 6 includes a pair of chassis opposite each other, which are provided substantially vertically to the bottom chassis 2 and the front chassis 4, though one of them is not illustrated in the drawings. The front chassis 4 and the side chassis 6 are formed integrally with the bottom chassis 2, by bending a single sheet metal, for example.

The rear chassis 5 is provided opposite the front chassis 4. The rear chassis 5 includes a plate part 50 overlappingly attached to the bottom plate part 20 of the bottom chassis 2, and a side plate part 51 bent and substantially vertically raised from the plate part 50. The plate part 50 is attached to the outer side of the casing 1 relative to the bottom plate part 20.

The plate part 50 includes an elastic piece 52 that is formed by cutting and raising a part of the plate part 50 toward the inner side of the casing 1 and thus seamlessly, integrally, and continuously extends from the plate part 50 toward the inner side of the casing 1. An end of the elastic piece 52 is a fixed end connecting to the plate part 50 and the other end thereof is a free end. On the free end, a protrusion part 52a in the direction to the outer side of the casing 1 is provided.

The rear chassis 5 is a second sheet metal member of the casing 1.

The circuit board 7 is fixed to the bottom chassis 2 with a screw 8. In the circuit board 7, a hole 70 that opposes the screw hole 21c of the component attachment part 21 when the circuit board 7 is aligned with the bottom chassis 2 is formed. Namely, the circuit board 7 is placed on the stand part 21b of the component attachment part 21, and by inserting the screw 8 into the hole 70 and screwing the screw 8 into the screw hole 21c, the circuit board 7 is thereby fixed.

Since the component attachment part 21 can be used for fixing a component such as the circuit board 7, it is not required to attach a cylindrical post to the bottom chassis 2 which is used in a conventional technique.

Further, metal chips produced from the screw 8 during screwing is discharged from the opening part 22 to the outside of the casing 1, such that the metal chips do not remain in the interior of the casing 1. Thus, a low cost screw which has a tendency to produce metal chips in screwing can be employed as the screw 8.

Note that, the bottom chassis 2 has a plurality of component attachment parts 21 disposed as required at positions that can overlap with the plate part 50. The circuit board 7 is fixed at the plurality of positions with a plurality of screws 8 as required.

Figure 2:
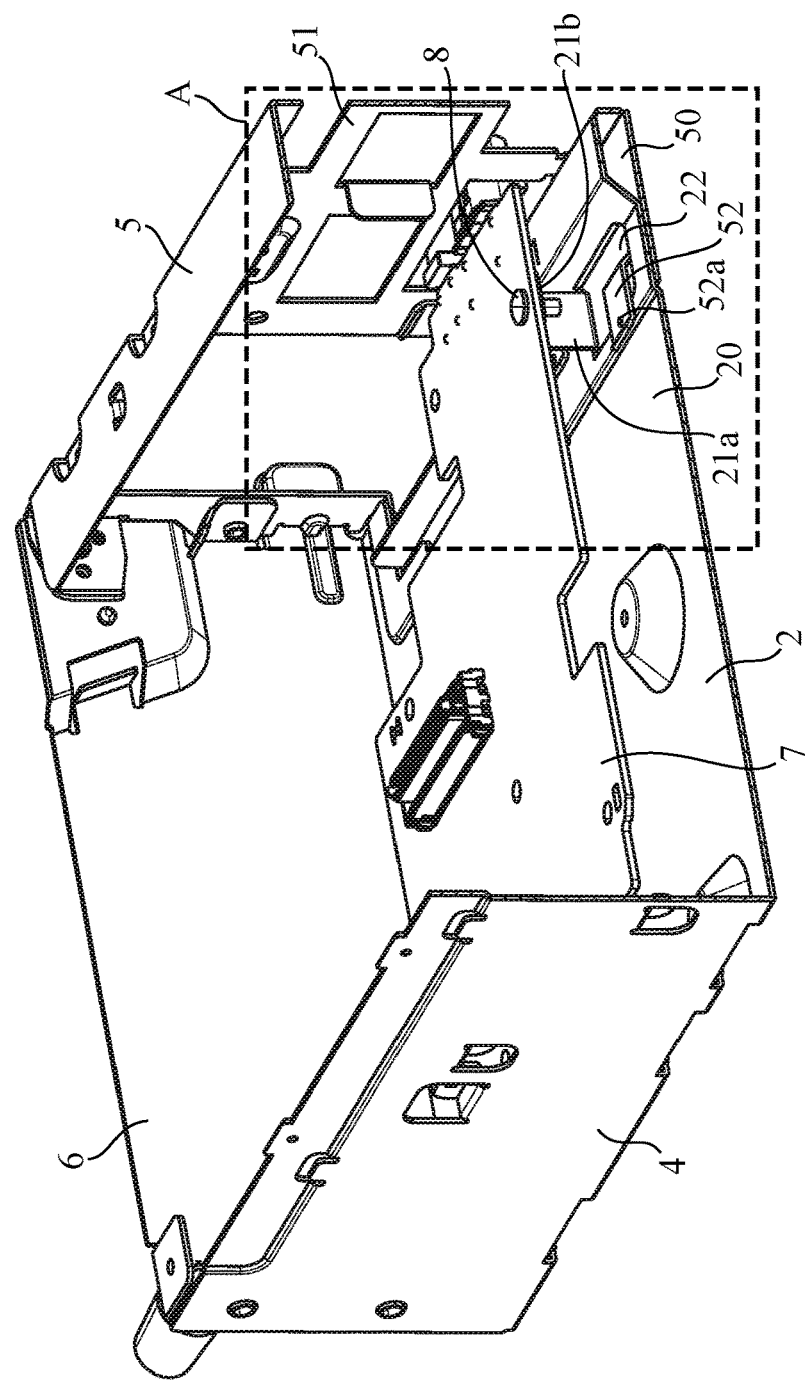
FIG. 2 is a partially broken perspective view of the casing of the electronic device according to the embodiment 1 of the present invention.
Figure 3:
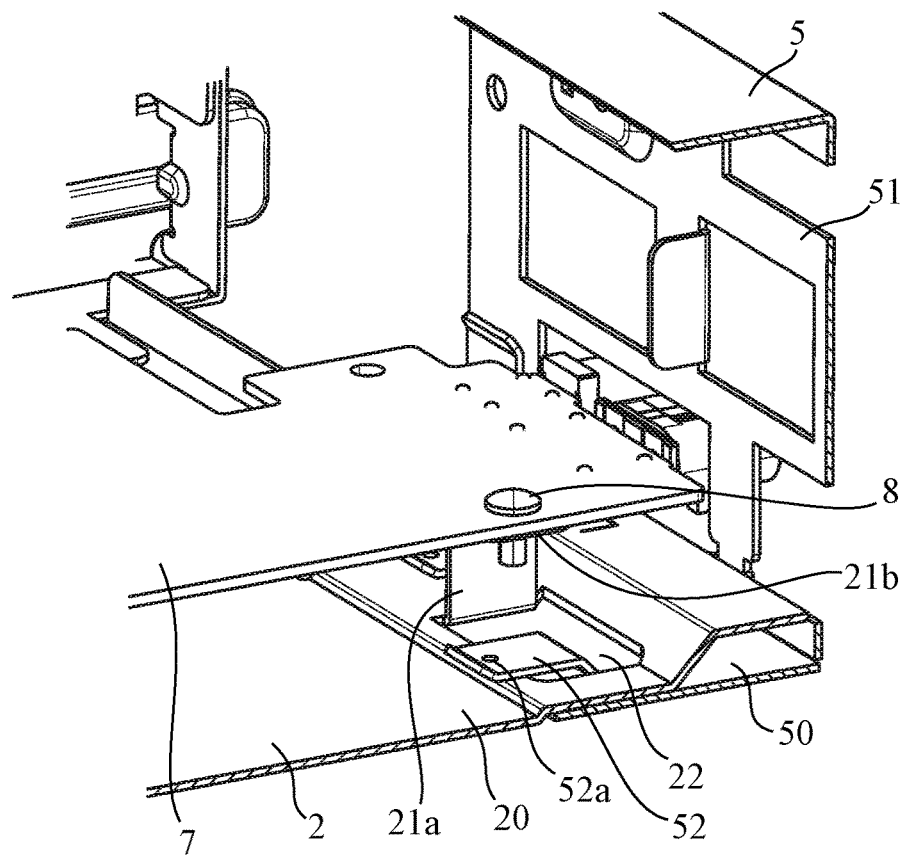
FIG. 3 is a partially enlarged view of FIG. 2.
Figure 4:
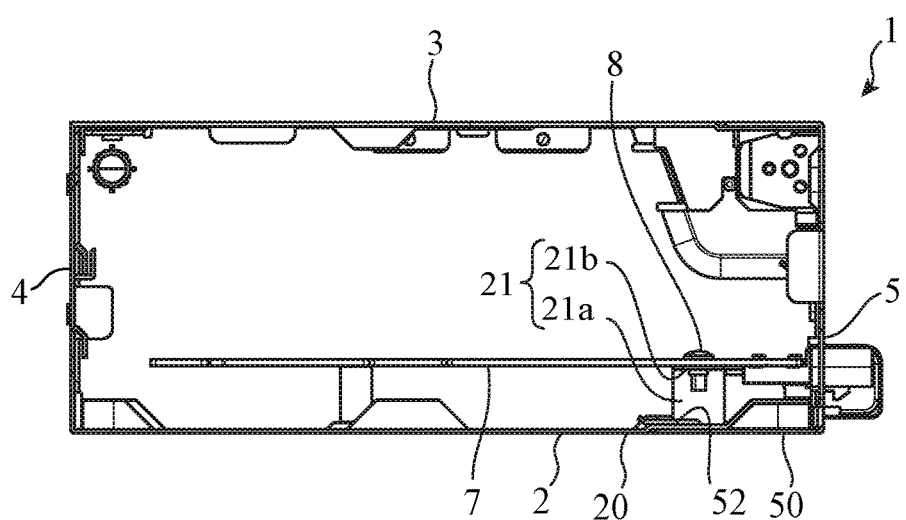
FIG. 4 is a cross-sectional view of the casing of the electronic device according to the embodiment 1 of the present invention.

FIGS. 2, 3, and 4 illustrate a state in which the circuit board 7 is screwed to the bottom chassis 2 and then the rear chassis 5 is attached to the bottom chassis 2 after the state shown in FIG. 1. FIG. 2 is a partially broken perspective view, and FIG. 3 is an enlarged view illustrating a portion A of FIG. 2. FIG. 4 is a cross-sectional view seen from the direction B in FIG. 2. In FIG. 2, the top chassis 3 is not illustrated.

The base face of the casing 1 is formed by the bottom chassis 2, and one of the side faces with respect to the base face is formed by the side plate part 51 of the rear chassis 5. The side face is one of the faces substantially orthogonal to the base face and composing the casing 1. It should be noted that, although the base face formed by the bottom chassis 2 serves as the bottom face of the casing 1 in the illustrated example, any other configuration may be employed. Namely, any of the respective faces composing the casing 1 having a box shape may be the base face formed by the bottom chassis 2. For example, the base face formed by the bottom chassis 2 may serve as the top face of the casing 1.

The rear chassis 5 is attached to the bottom chassis 2 such that the free end of the elastic piece 52 passes through the opening part 22 from the outer side to the inner side of the casing 1 and the plate part 50 overlaps with the bottom plate part 20 on the outer side of the casing 1.

After the rear chassis 5 is attached to the bottom chassis 2, the opening part 22 is closed by the plate part 50 extending seamlessly, integrally, and continuously from the plate part 51 and being substantially orthogonal to the side plate part 51. This can prevent foreign substances from intruding into the casing 1 through the opening part 22. No dedicated cover member is needed for closing the opening part 22, which is different to a conventional technique.

Further, when the rear chassis 5 is attached to the bottom chassis 2, the elastic piece 52 passing through the opening part 22 is elastically deformed so as to come into contact with the bottom plate part 20 at the edge part of the opening part 22 via the protrusion part 52a. As a result, it is possible to secure the conductivity between the bottom chassis 2 and the rear chassis 5 and enhance the EMC.

It should be noted that the end of the elastic piece 52 may be configured to be in contact with the bottom plate part 20 without providing the protrusion part 52a. In addition, a recess to which the protrusion part 52a fits may be provided in the bottom plate part 20 such that the protrusion part 52a serves as a dowel to prevent the rear chassis 5 from disengaging from the bottom chassis 2.

In the description above, the free end of the elastic piece 52 passes through the opening part 22 from the outer side to the inner side of the casing 1, and the plate part 50 closes the opening part 22 on the outer side of the casing 1. In other words, in this configuration, an application to the casing, in which the plate part 50 of the rear chassis 5 is attached to the outer side relative to the bottom plate part 20 of the bottom chassis 2, is assumed. However, the casing may have a configuration in which the plate part 50 of the rear chassis 5 is attached to the inner side relative to the bottom plate part 20 of the bottom chassis 2. In this case, the following configuration may be employed: the free end of the elastic piece 52 passes through the opening part 22 from the inner side to the outer side of the casing 1, and the plate part 50 closes the opening part 22 on the inner side of the casing 1.

As described above, in the casing 1 of an electronic device according to this embodiment 1, a circuit board 7 is fixed with a screw 8 at the component attachment part 21 cut and raised from the bottom plate part 20 of the bottom chassis 2 toward the inner side of the casing 1. Then, the opening part 22 formed with the component attachment part 21 is then closed by attaching the rear chassis 5, and the bottom chassis 2 and the rear chassis 5 come into contact with each other via the elastic piece 52. A component such as the circuit board 7 can thus be fixed without providing posts. In addition, the EMC can be enhanced and a countermeasure for foreign substances can be provided by the assembly of the bottom chassis 2 and the rear chassis 5 without newly providing an additional member. As a result, the number of components and the cost can be reduced. In addition, such a configuration contributes to the size reduction of the electronic device.

Further, the elastic piece 52 is configured to come into contact with an edge part of the opening part 22 via the protrusion part 52a provided at the end of the elastic piece 52. Thus, the bottom chassis 2 and the rear chassis 5 can come into contact with each other more securely.

It should be noted that the invention according to the present invention can include modification or omission of any component in embodiments within the scope of the invention.

INDUSTRIAL APPLICABILITY

As described above, the casing of an electronic device according to the present invention is suitable for use as a casing of a car navigation device or the like, because a component such as a circuit board can be fixed without providing a post, and it is possible to enhance the EMC and provide a countermeasure for foreign substances by the assembly of the members which form the casing.

REFERENCE SIGNS LIST 1 casing
2 bottom chassis
3 top chassis
4 front chassis
5 rear chassis
6 side chassis
7 circuit board
8 screw
20 bottom plate part
21 component attachment part
21a wall part
21b stand part
21c screw hole
22 opening part
50 plate part
51 side plate part
52 elastic piece
52a protrusion part
70 hole

The invention claimed is:

1. A casing of an electronic device, the casing comprising:
a base face formed by a first sheet metal member including a component attachment part formed by cutting and raising from the first sheet metal member toward an inner side of the casing so as to form an opening part, the component attachment part having a screw hole for fixing a component, the screw hole being provided at a position opposite the opening part; and
a side face formed by a side plate part included in a second sheet metal member, the second sheet metal member including: a plate part which has an elastic piece having a free end and formed by cutting and raising from the second sheet metal member toward the inner side of the casing; and the side plate part bent from the plate part;
wherein the plate part of the second sheet metal member overlaps with the first sheet metal member at an outer side of the casing and closes the opening part, and wherein the free end of the elastic piece passes through the opening part from the outer side to the inner side of the casing and comes into contact with an edge part of the opening part.

2. The casing of the electronic device according to claim 1, wherein the elastic piece is in contact with the edge part of the opening part via a protrusion part formed at the free end.

* * * * *